Oct. 20, 1970 P. W. MEYER 3,535,594

PRINTED CIRCUIT BOARD EXTRACTOR

Filed April 11, 1968

INVENTOR.
Peter W. Meyer
BY
Shenier & O'Connor
ATTORNEYS

United States Patent Office 3,535,594
Patented Oct. 20, 1970

3,535,594

PRINTED CIRCUIT BOARD EXTRACTOR

Peter W. Meyer, Fairfield, Conn., assignor to United Aircraft Corporation, East Hartford, Conn., a corporation of Delaware Filed Apr. 11, 1968, Ser. No. 720,645
Int. Cl. H02b *1/02*
U.S. Cl. 317—101 7 Claims

ABSTRACT OF THE DISCLOSURE

An extractor for a printed circuit board slidably mounted for movement respectively into and out of a board housing having a lid between an operative position and an inoperative position wherein the extractor comprises a flat ring pivotally mounted on the board adjacent the edge thereof for movement in a plane parallel to the board surface between a first inoperative position overlying the board and a second operative position extending outwardly from the board edge. A boss on the ring at its pivot spaces the ring above the board a sufficient distance to prevent interference between the ring in its inoperative position and leads extending above the surface of the board. A tab on the ring extending perpendicularly from the plane of movement of the ring facilitates the operation of moving the ring from its inoperative to its operative position and cooperates with the edge of the board to limit movement of the ring in both directions respectively to its operative and to its inoperative position. In the inoperative position of the ring the tab lies flat against the edge of the board to prevent interference with closing of the lid on the housing.

BACKGROUND OF THE INVENTION

Printed circuit boards known in the prior art usually have conductors on one surface thereof and have a plurality of pin connectors extending outwardly from one edge thereof. These boards customarily are installed in housings which slidably receive the boards for insertion of the connecting pins in pin receptacles in which the pins are frictionally retained. The edge of the board remote from the pins is accessible upon movement of a housing lid from a position over the board edge to a position away from the board edge. Owing to the fact that a large number of pin connectors frictionally engage the connector receptacles, a relatively large force is required to withdraw a board from the housing to permit the board to be repaired or replaced.

Attempts have been made in the prior art to provide some means for facilitating withdrawal of the boards from the housing. Generally, the means proposed in the prior art have been tools which detachably engage the boards to facilitate pulling of the boards out of the housing. While some of these devices for the most part successfully accomplish their intended object, they embody a number of defects. Perhaps the most significant defect is that which they have in common with all tools, in that they are not at all times readily accessible when the operation for which they are designed is to be performed. They are, moreover, relatively complicated, cumbersome and expensive to construct for the result achieved thereby. Some of them require that the board itself be specially constructed to accommodate the tool.

I have invented a circuit board extractor which overcomes the difficulties associated with board extracting tools of the prior art. My circuit board extractor is permanently secured to the board itself. I so construct my extractor that it does not interfere either with the leads on the surface of the board or with closing of the board housing lid. My extractor is extremely simple for the result achieved thereby. It is inexpensive to construct.

SUMMARY OF THE INVENTION

One object of my invention is to provide an extractor for a printed circuit board which overcome the defects of board extracting tools of the prior art.

Another object of my invention is to provide an extractor for a printed circuit board which forms a permanent part of the board assembly.

A further object of my invention is to provide an extractor for a printed circuit board which permits the board to be extracted in a rapid and expeditious manner.

A still further object of my invention is to provide an extractor for a printed circuit board which is built in and which will not interfere either with the leads on the surface of the circuit board or with the board housing lid.

Still another object of my invention is to provide an extractor for a printed circuit board which is simple and inexpensive to construct and to install.

Other and further objects of my invention will appear from the following description.

In general my invention contemplates the provision of an extractor for a printed circuit board which is slidably mounted in a board receptacle for movement between an inserted operative position and a withdrawn inoperative position wherein the extractor is a flat ring pivotally mounted for movement adjacent an edge of the board which is remote from the board pins for movement in a plane parallel to the surface of the board. A boss on the ring at the pivot spaces the ring from the board surface to prevent interference between the ring and the leads or conductors on the surface of the board. A lug extending generally perpendicularly from the plane of movement of the ring coperates with the edge of the board to limit movement of the ring to each of its two positions. In the inoperative position of the ring the lug or tab lies flat against the edge of the board to prevent interference with closing of the housing lid.

BRIEF DESCRIPTION OF THE DRAWINGS

In the accompanying drawings which form part of the instant specification and which are to be read in conjunction therewith and in which like reference numerals are used to indicate like parts in the various views.

DESCRIPTION OF THE PREFERRED EMBODIMENT

Figures 1, 2, 3:
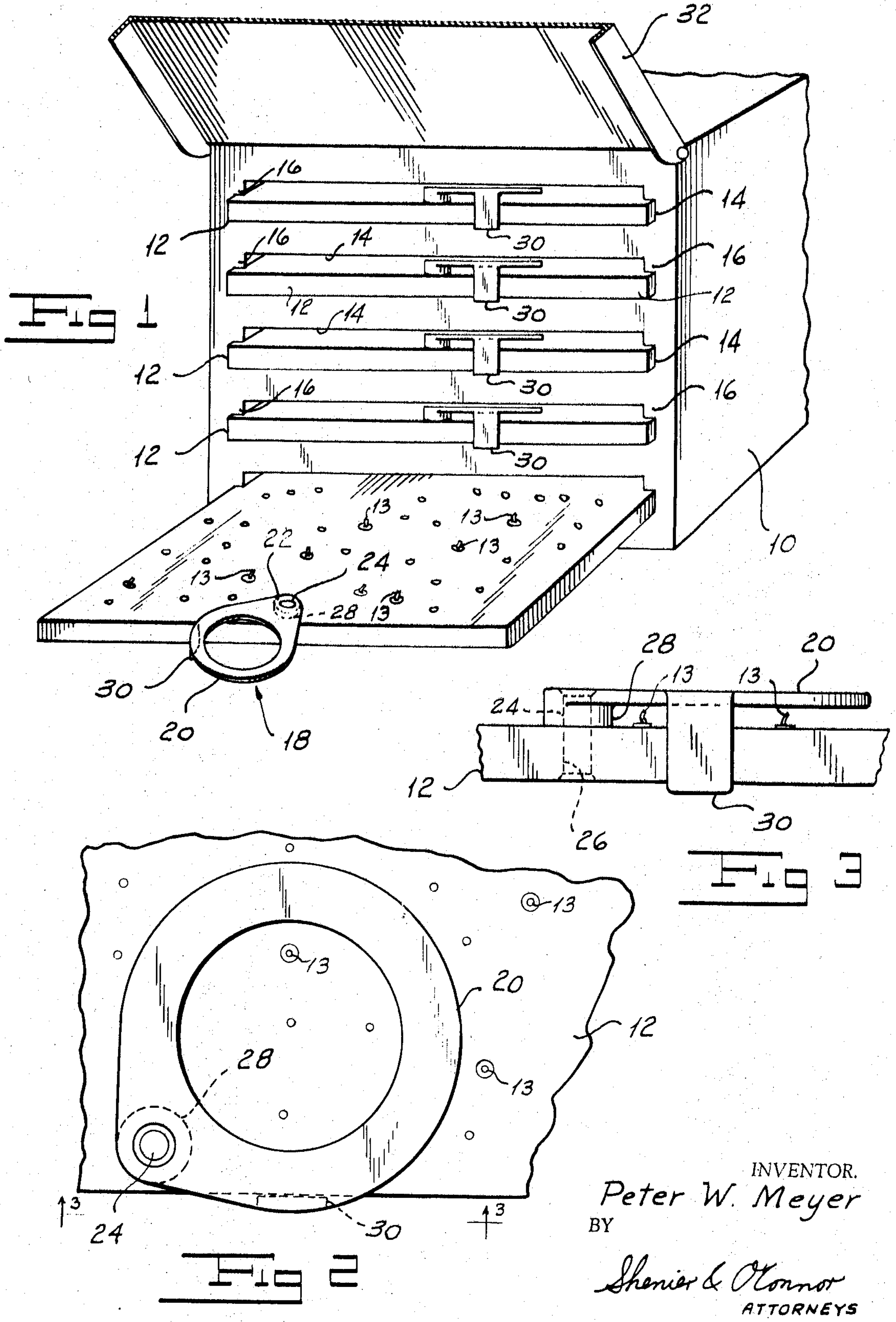
FIG. 1 is a fragmentary bottom perspective view of a circuit board housing containing a number of boards, all of which are provided with my printed circuit board extractor, with one board withdrawn to expose the underside thereof.
FIG. 2 is a fragmentary plan view of a circuit board provided with my adapter.
FIG. 3 is a fragmentary side elevation of the circuit board shown in FIG. 2 taken along the line 3—3 of FIG. 2.

Referring now to the drawings, I have shown schematically in FIG. 1 a housing 10 adapted to receive a plurality of printed circuit boards 12, each of which may have a number of snipped component lead ends 13 extending below the undersurface thereof as viewed in FIG. 1. The housing 10 is provided with a plurality of vertically spaced guide slots 14, the sides of which are provided with bosses 16 for guiding the board into the slot in such a position as will cause the board contact pins (not shown) to be aligned with the pin receptacles (not shown) at the rear of the housing. The bosses 16 space the surfaces of the boards from the contral portions of the edges of the slots 14 to prevent any interference with elements on the board.

My printed circuit board extractor, indicated generally by the reference character 18, includes a flat ring 20 which is enlarged at a pivot portion 22 to permit the ring to receive a rivet or the like 24 which extends through the pivot portion 22 and through a hole 26 in the board pivotally to support the extractor on the board. I form the pivot portion 22 of the ring 20 with a boss 28 which spaces the ring portion 20 a sufficient distance below the undersurface of the board to prevent interference between the snipped component lead ends 13 and the ring 20 as the latter moves.

I further form the ring 20 with a tab 30 which extends perpendicularly from the plane of the ring downwardly in the direction of the board. I so form the tab 30 that with the ring 20 moved on its pivot in a counterclockwise direction, as viewed in FIGS. 1 and 2, ultimately the tab prevents further movement of the ring in this direction. In this position the tab 30 lies flat against the edge of the board. Owing to this arrangement, the lid 32 of the housing 10 can be closed over the housing without interference between the tab and the lid. When the ring 20 is moved in a clockwise direction on its pivot from the position shown in FIG. 2 to the position shown for the lowermost board 12 in FIG. 1, ultimately an edge of the tab 30 engages the edge of the board to prevent further movement of the ring in that direction. The ring is then in a position at which an operator's finger can be inserted through the ring to permit the board to be extracted.

In a particular instance, I formed the ring portion 20 and the tab 30 of my extractor from .040 inch sheet stock of a suitable synthetic resin such as nylon. I provided a spacer boss 28 extending about .093 inch from the surface of the ring portion 20. A .0125 inch semi-tubular aluminum rivet was used to pivotally attach the extractor to the board. An extractor of this construction was found to be capable of withstanding a straight pull in excess of 20 pounds without appreciable deformation, such a pull being well in excess of that required normally to extract a board.

In operation of my extractor for printed circuit boards, a plurality of the boards 12 are inserted in the slots 14 with their pins being moved into the pin contact receptacles. In this position of the board, normally the rings 20 are moved to positions in which the tabs or lugs 30 lie against the edges of the boards and the cover 32 can be closed on the housing 10 to protect the boards. In this position of the rings 20, there will be no interference between the rings and the conductors 13 on the surface of the board owing to the spacing provided by the boss 28. Neither will the tabs or lugs 30 interfere with closing of the lid over the housing adjacent the exposed board edges.

When for any reason, such as repair or replacement, an operator wishes to remove one of the boards, he merely picks the tab 30 away from the edge of the board against which it rests and rotates the ring 20 in a clockwise direction until the edge of the tab strikes the edge of the board. With the extractor in this position, he may insert his finger through the ring and withdraw the board. A new board may readily be inserted merely by pushing the board into the slot 14 and in the course of this operation swinging the extractor ring 20 to a position at which the lug 30 lies against the edge of the board.

It will be seen that I have accomplished the objects of my invention. I have provided a circuit board extractor which overcomes the defects of board extracting tools of the type known in the prior art. My printed circuit board extractor forms a permanent part of the board assembly. It is so constructed as to avoid interference both between the extractor and snipped lead ends of components on the board and between the lid of the board housing and the extractor. It is relatively simple and inexpensive to construct and to install.

It will be understood that certain features and subcombinations are of utility and may be employed without reference to other features and subcombinations. This is contemplated by and is within the scope of my claims. It is further obvious that various changes may be made in details within the scope of my claims without departing from the spirit of my invention. It is, therefore, to be understood that my invention is not to be limited to the specific details shown and described.

Having thus described my invention, what I claim is:

1. A circuit board assembly including in combination, a circuit board carrying conductors on a surface thereof, said circuit board having an edge, an extractor comprising a flat ring, means mounting said ring on said board adjacent an edge thereof for pivotal movement from an inoperative position overlying said board and an operative position extending outwardly from said board in a plane generally parallel to said surface of said board, a boss for spacing said ring above said surface of said board in the inoperative position of said ring and a flat tab on said ring extending outwardly from the plane of movement of said ring adjacent said board edge, said tab adapted to lie flat against said edge of said board in the inoperative position of said ring and to engage said edge of said board with an edge of the tab in the operative position of said ring.

2. An assembly as in claim 1 in which said ring and said boss and said tab comprise an integral body of synthetic resin.

3. An extractor for a circuit board mounted for sliding movement in a housing between a housed position at which an edge of said board is accessible and a housed position including a planar puller ring, means mounting said puller ring at a point around the periphery thereof on one surface of said board adjacent said edge for pivotal movement around an axis generally perpendicular to one surface of said board and to the ring for movement between an inoperative position overlying said one surface of the board and an operative position extending outwardly from said board edge with the ring opening accessible and a lug on the periphery of said ring at a point spaced from said mounting means, said lug extending downwardly from said one board surface toward the other board surface to engage said board edge in the inoperative position of said ring and to engage said board edge in the operative position of said ring to limit movement of said ring to its operative position.

4. An extractor as in claim 3 in which said mounting means comprises a spacer between said ring and said one surface of said board.

5. An extractor as in claim 4 in which said ring and said lug and said spacer are integrally formed.

6. An extractor as in claim 3 in which said lug is a flat tab, said tab adapted to lie flat against said board edge in the inoperative position of said ring and to engage said board edge with an edge of said tab in the operative position of said ring.

7. An extractor as in claim 6 in which said mounting means includes a boss on said ring for spacing said ring from said one surface of said board.

References Cited

UNITED STATES PATENTS

| | | | |
|---|---|---|---|
| 2,177,554 | 10/1939 | Stiff | 16—127 |
| 2,951,185 | 8/1960 | Buck. | |

FOREIGN PATENTS

| | | |
|---|---|---|
| 192,070 | 10/1964 | Sweden. |

ROBERT K. SCHAEFER, Primary Examiner

D. SMITH, Jr., Assistant Examiner

U.S. Cl. X.R.

16—126, 127